United States Patent [19]

Kobari et al.

[11] Patent Number: 4,908,738

[45] Date of Patent: Mar. 13, 1990

[54] DRIVE MOTOR CONTROL UNIT

[75] Inventors: Katsuo Kobari, Tachikawa; Naoto Ota, Yamanashi; Naoyuki Suzuki, Yamanashi; Yuji Kanamori, Yamanashi, all of Japan

[73] Assignee: Fanuc Ltd, Minamitsuru, Japan

[21] Appl. No.: 233,652

[22] PCT Filed: Dec. 18, 1987

[86] PCT No.: PCT/JP87/00995

§ 371 Date: Jul. 8, 1988

§ 102(e) Date: Jul. 8, 1988

[87] PCT Pub. No.: WO88/04879

PCT Pub. Date: Jun. 30, 1988

[30] Foreign Application Priority Data

Dec. 19, 1986 [JP] Japan ................... 61-303021
Dec. 19, 1986 [JP] Japan ................... 61-303022
Dec. 19, 1986 [JP] Japan ................... 61-303023

[51] Int. Cl.[4] .............................................. H02B 1/04
[52] U.S. Cl. ................................ 361/429; 361/399; 361/412; 439/74
[58] Field of Search ................... 248/27.1, 27.3; 200/296; 357/81; 361/346, 347, 353, 383, 384, 386, 388, 395, 399, 412, 413, 424, 429; 439/65, 69, 74; 211/41

[56] References Cited

U.S. PATENT DOCUMENTS

| 3,631,299 | 12/1971 | Meyer | 361/412 |
| 4,339,628 | 7/1982 | Mancantonio | 361/412 |
| 4,444,318 | 4/1984 | Alexander | 361/412 |
| 4,520,425 | 5/1985 | Ito | 361/399 |

FOREIGN PATENT DOCUMENTS

| 3934701 | 11/1964 | Japan . |
| 162691 | 7/1981 | Japan . |
| 57-49433 | 10/1982 | Japan . |

*Primary Examiner*—Gerald P. Tolin
*Attorney, Agent, or Firm*—Staas & Halsey

[57] ABSTRACT

A motor drive unit used in controlling an AC motor which drives the spindle or feed shaft of a machine tool is suitable for automatic assembly in which a plurality of electrical components are mounted and wired. In accordance with the motor drive unit of the invention, an upper frame (2) supporting a printed circuit board (1) having electrical circuitry which employs control semiconductors, and a lower frame (4) for mounting a heat radiating device (5), which mounts a rectifier or the like, as well as a power resistor (6), are constructed of synthetic resin. A power board (3) on which power circuit components are connected by soldering is sandwiched between the two frames (2), (4) and has the components on the heat radiating device (5) and the power resistor (6) mounted and connected thereto by screws. The two frames (2), (4) are fastened together by screws (25).

8 Claims, 3 Drawing Sheets

DRIVE MOTOR CONTROL UNIT

BACKGROUND OF THE INVENTION

1. Field of the Invention

This invention relates to a motor drive unit for accommodating electrical components used in controlling an AC motor.

2. Description of the Related Art

A motor drive circuit shown in the circuit diagram of FIG. 4, by way of example, is used as a control apparatus for an AC motor which drives the spindle or feed shaft of a machine tool. Electrical components such as an electromagnetic contactor A, rectifying diode B, smoothing capacitor C, regenerative transistor D, transistor bridge E and filter F, as well as electrical components such as a power resistor and fuse, are connected to a circuit extending from three-phase AC power supply terminals R, S, T shown in FIG. 4 to terminals U, V, W for feeding current to the AC motor.

The large electrical components among these components are connected to a mounting board by screws and are connected by using a cluster of wires, after which the components are housed in a metal case consisting of worked sheet metal.

In the control apparatus accommodated in the above-mentioned metal case, the various electrical components which are each of a different shape are first fixed and then interconnected by the cluster of wires. Consequently, assembling the motor drive unit requires labor, and thus, automating the operation as by using an assembling robot involves many difficulties.

Furthermore, since the worked sheet-metal case is used as the external housing, problems arise in terms of cost and weight.

SUMMARY OF THE INVENTION

The present invention solves the aforementioned problems. An object is to provide a motor drive unit in which the control circuit and power circuit of a motor are mounted on individual plastic frames, and the components in the power circuit are interconnected by soldering or screw clamping using a wiring board. Thus, a metal case of worked plate metal and a wire cluster for wiring are no longer necessary.

In accordance with the present invention, there is provided a motor drive unit having a first frame made of synthetic resin for supporting a printed circuit board mounting control circuit components from among electrical components which drive and control an AC motor, a second frame made of synthetic resin for securing power circuit components from among said electrical components, and a connecting power distribution board having one surface on which components for connection by soldering are arranged and connected by soldering, and another surface on which components for connection by screws are connected by screws, these components being those from among the power circuit components, the connecting power distribution board being sandwiched between the two frames when the two frames are joined.

Thus, the motor drive unit of the present invention dispenses with the clustering of wires and the worked sheet-metal frame, simplifies the unit assembly operation and is more compact.

Further, in accordance with the invention, the power board sandwiched between the upper and lower frames allows the upper power circuit components to be connected by soldering and allows the electric circuitry of the lower power circuit components to be connected by screw clamping. As a result, operations requiring labor, namely the wiring of components and the clustering of wires, can be dispensed with to improve operating efficiency.

In accordance with the invention, the plastic upper and lower frames are joined into one. This makes it possible to dispense with the metal case of worked sheet metal so that cost and weight can be reduced.

DETAILED DESCRIPTION OF THE PREFERRED EMBODIMENTS

An embodiment of the present invention will now be described in detail with reference to the drawings.

Figure 1:
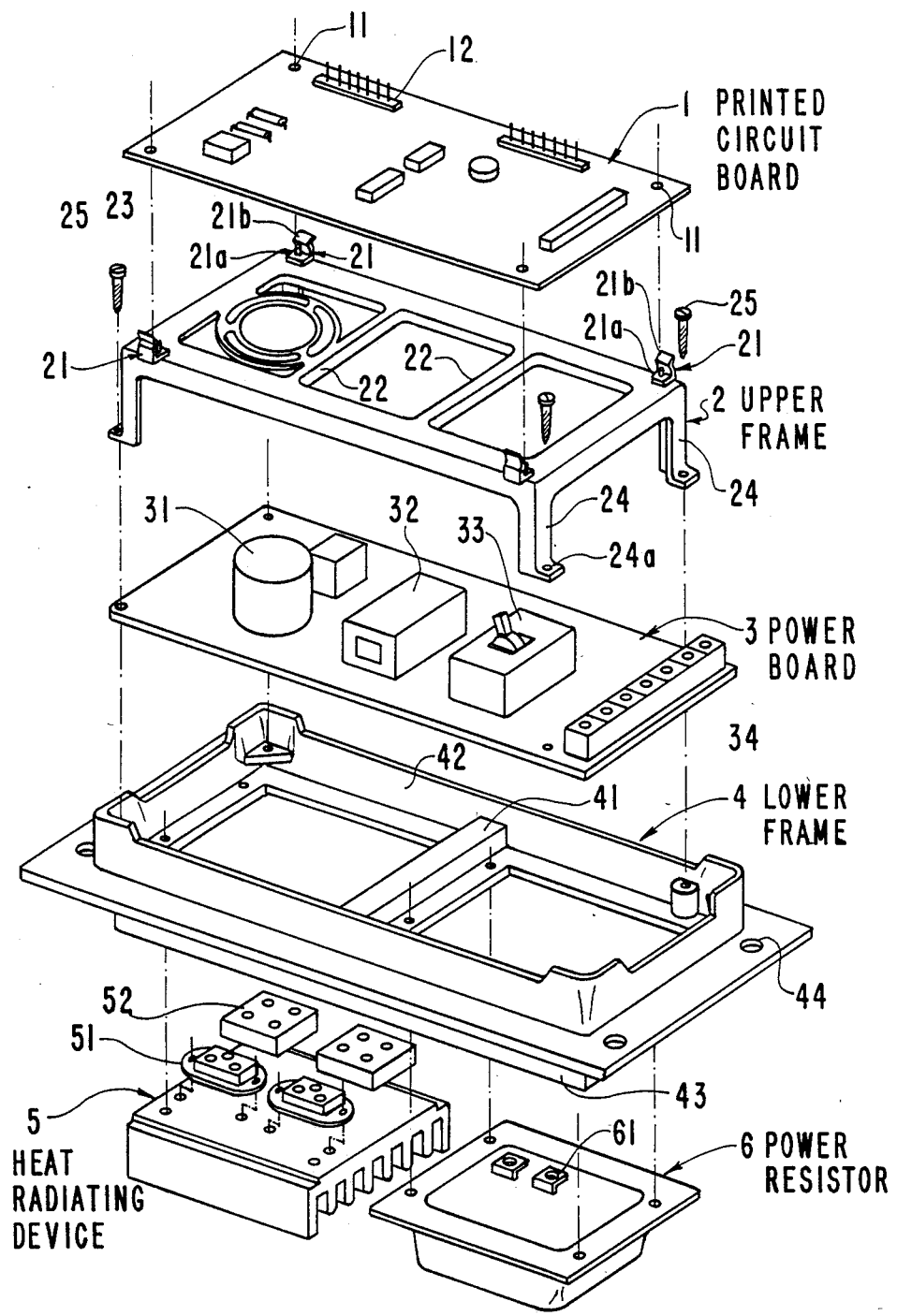
FIG. 1 is an exploded, perspective view showing an embodiment of a motor drive unit according to the present invention.

FIG. 1 is an exploded, perspective view showing an embodiment of a motor drive unit according to the present invention. In FIG. 1, numeral 1 denotes a printed circuit board provided with printed wiring and on which control semiconductor elements and such components as resistors and capacitors for the accessory electrical circuitry are mounted, thus constructing the control circuit for an AC motor (not shown). Mounting holes 11 are provided near the edge of the printed circuit board 1. By engaging the mounting holes with holders 21 of an upper frame 2, the printed circuit board 1 is supported on the upper frame 2. Numeral 12 denotes a connector for connecting electrical circuitry.

The upper frame 2 includes a molded part made of synthetic resin. The upper surface of the upper frame has a rib 22 for reinforcing the upper frame 2 and is equipped with a support portion 23 for supporting a large-capacity capacitor 31, such as a smoothing capacitor. Provided near the edge of the upper frame 2 on the upper surface thereof are the holders 21, each of which has a pin 21a inserted into the corresponding mounting hole 11 of the printed circuit board 1, and a claw portion 21b by which the printed circuit board 1 is clamped. The printed circuit board 1 is thus retained on the upper frame 2.

Numeral 24 denotes a leg provided at each of the four corners of the upper frame 2. The leg 24 has a leg hole 24a on its lower end. The arrangement is such that the upper frame is attached by tapping screws 25 to a lower frame 4 so as to sandwich a power board 3 (described below).

The power board 3 has laminated printed circuit boards and mounts such AC motor power components as a smoothing capacitor 31, electromagnetic contactor 32, circuit breaker 33 and power terminal 34. The conductor portions are connected to copper foil portions on the power board 3 by soldering.

Figure 2:
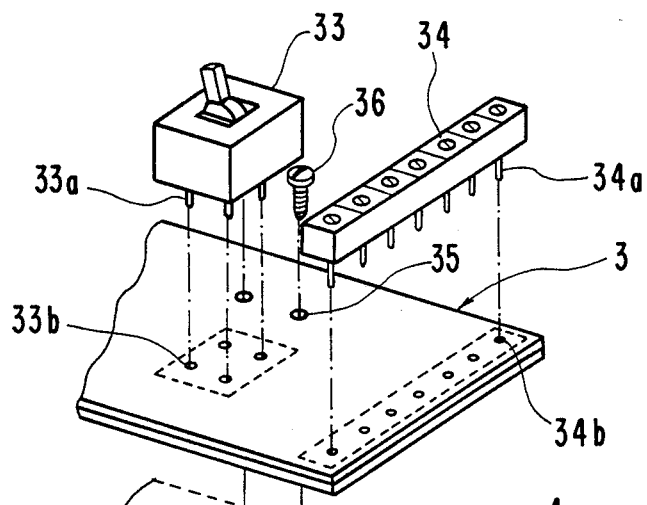
FIG. 2 is a partial, exploded view illustrating an example of a method of mounting power circuit components on a power board according to the present invention.
Figure 2:
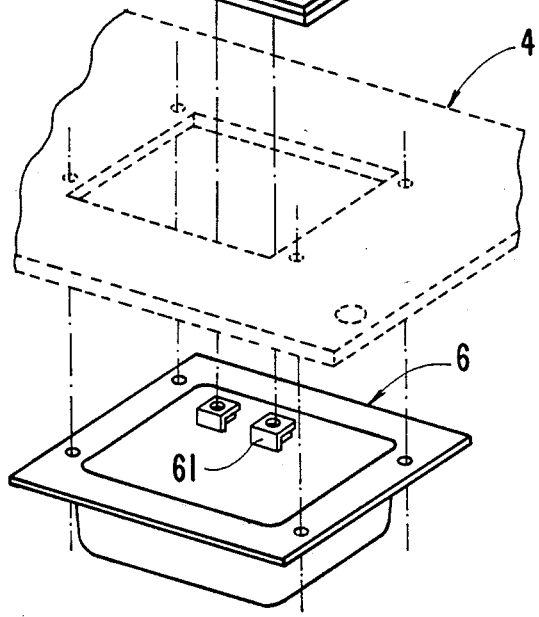

FIG. 2 illustrates an example of a method of mounting the power circuit components on the power board 3. The circuit breaker 33 having terminal pins 33a is placed at a position corresponding to board holes 33b drilled in the power board 3 at predetermined locations. The inserted terminal pins 33a are soldered to the foil portions, which constitute electrical wiring, from the bottom side of the power board 3, whereby the circuit breaker 33 is secured to the power board 3 and connected. The power terminal 34 also is secured by inserting terminal pins 34a at positions corresponding to the board holes 34b of power board 3 and soldering these terminal pins from the bottom side.

Next, the power board 3 and the power resistor 6 are electrically connected. Specifically, a bolt 36 is tightened through a wiring hole 35, which is provided in the copper foil serving as the wiring of power board 3, so as to correspond to a nut portion of a terminal 61 embedded in the power resistor 6, thereby providing excellent conduction.

Figure 3:
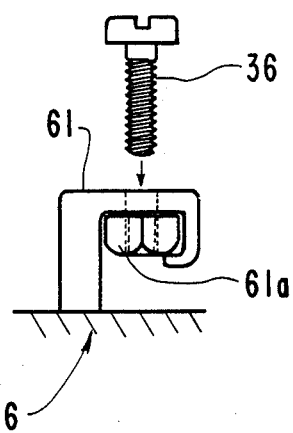
FIG. 3 is a side elevational view of a floating nut according to the present invention.
Figure 4:
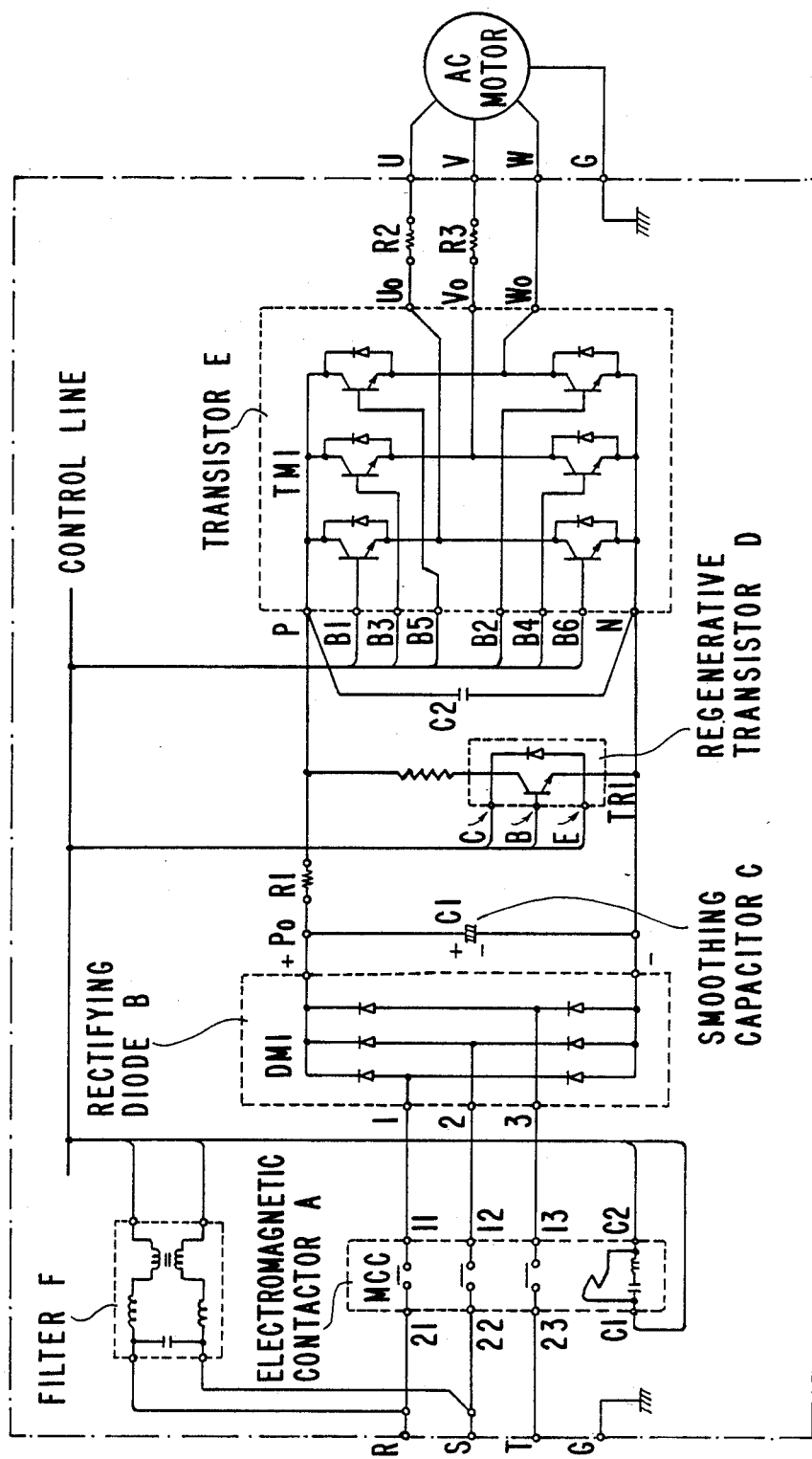
FIG. 4 is a circuit diagram showing an example of a motor drive unit for controlling an AC motor.

FIG. 3 is a side view for a case where the terminal 61 uses a floating nut 61a. The nut portion of the terminal 61 embedded in the power resistor 6 is so arranged that, e.g., the hexagonal floating nut 61a is embraced by the terminal 61 so as to be capable of undergoing a predetermined, slight amount of movement vertically and laterally for play without turning about its central axis. Even if the central axis of the bolt 36 and that of the floating nut 61a are somewhat off-center when bolt 36 is screwed in from above, the distal end of the bolt 36 will shift the floating nut 61a to bring both of the central axes into coincidence. This enables the screw clamping operation to be readily performed even if the bolt is screwed in by a robot.

Accordingly, among the power circuit components fixed to the lower frame 4 from below, those components connected by screwing having the floating nuts 61a as their terminals, such as the power resistor 6, are connected to the electrical circuitry by fastening the floating nuts to the power board 3 by the bolts 36.

The lower frame 4 is formed of a molded part of synthetic resin in such a manner that the upper frame 2 having the printed circuit board 1 and the power board 3 may be attached to the lower frame 4 from above. A heat radiating device 5 mounting a power semiconductor element requiring heat dissipation and the power resistor 6 may be attached to the lower frame 4 from below. The lower frame 4 is formed to have, on its top and bottom surfaces, a rib 41 for reinforcing the frame and for supporting the power board 3, an upper barrier wall 42 for preventing dust from attaching to the component mounting surfaces of the power board 3 in the horizontal direction, and a lower barrier wall 43 covering flange surfaces of the heat radiating device 5 and power resistor 6. The opening of the upper barrier wall 42 is formed to have dimensions larger than those of the power board 3 and the arrangement of the legs 24 of upper frame 2. These dimensions are gradually reduced until a predetermined mounting position of the power board 3 is reached. Therefore, the arrangement is such that when the power board 3 and upper frame 2 are mounted on the lower frame 4, these are received within the opening of the lower frame 4 and are thereby readily guided to the predetermined mounting position.

A power transistor 51 requiring heat dissipation and a power module 52 such as a rectifier are attached to the top surface of the head radiating device 5 and their terminal portions are arranged to project upwardly. A resistor body having a large current capacity is embedded within the interior of the power resistor 6 and has an upwardly projecting terminal portion 61. Numeral 44 denotes a securing hole which is a bolt hole for securing the unit to a magnetics panel, not shown.

The assembly of the motor drive unit of the present embodiment will now be described. First, the mounting holes 11 of the printed circuit board 1 on which the control circuit is constructed are engaged with the holders 21 of the upper frame 2 to retain the board on the upper frame. Next, the heat radiating device 5, which has the power transistor 51 and the power module 52 mounted thereon, and the power resistor 6 are fastened to the lower frame 4 from below by screws. The power board 3, on the upper portion of which are secured the power circuit components such as the power terminal 34 and circuit breaker 33 that are connected by soldering, is then placed on the lower frame 4. The power transistor 51, power module 52 and power resistor 6, which are attached to the upper portion of the heat radiating device 5, are fastened and electrically connected to the nut portions and floating nuts of the terminal 61 and the like, as shown in FIGS. 2 and 3, by the bolts 36 from above the power board 3.

At the end of the foregoing assembly operation, the upper frame 2 is set upon the power board 3, which has been placed upon the lower frame 4, and the upper frame 2 is fastened to the lower frame 4 by tapping screws 25 via the leg holes 24a of the upper frame. This unites the printed circuit board 1, the upper frame 2, the power board 3, the lower frame 4, the heat radiating device 5 and the power resistor 6 into a whole and assembles them as a motor drive unit.

Though the present invention has been described in conjunction with an embodiment thereof, the invention can be modified in various ways without departing from the scope of the claims.

The motor drive unit of the present invention is easy to assemble and lends itself well to automatic assembly by robot or the like.

We claim:

1. A drive motor control unit including electrical components, which include control circuit components and power circuit components, to be used in controlling an AC motor, comprising:
   a control circuit board mounting said control circuit components;
   a first frame having a top, a central space, and a plurality of legs extending downwardly from the top and supporting the control circuit board on said top;
   a connecting power distribution board having upper and lower surfaces and mounting said power circuit components; and
   a second frame having an upper surface, a lower surface, and a central space, the connecting power distribution board being connected to the upper surface; said first frame being connected to said second frame to support said control circuit board over said connecting power distribution board;
   at least some of the power circuit components being electrically connected to the lower surface of the connecting power distribution board and being mechanically supported by the lower surface of the second frame.

2. A drive motor control unit according to claim 1, wherein the electrical connection of some of the power circuit components to the lower surface of the connecting power distribution board being made through the central space of the second frame by threaded fasteners extending through the power distribution board from the upper surface of the second frame.

3. A drive motor control unit according to claim 1, wherein said first and second frames are made of molded synthetic resin.

4. A drive motor control unit according to claim 1, wherein the control circuit board has a plurality of mounting holes and the first frame comprises a plurality of holders, each having a pin passing through a corresponding one of the mounting holes of the control circuit board and a claw clamping said control circuit board, on the upper surface of the first frame and being disposed near an edge portion of said first frame on the upper surface thereof.

5. A drive motor control unit according to claim 1, wherein said first frame has four corners and one of the plurality of legs is formed at each of the four corners, said legs providing a predetermined clearance between the first frame and the second frame.

6. A drive motor control unit according to claim 2, wherein at least one of the power circuit components includes at least one floating nut threadedly engaging one of the threaded fasteners.

7. A drive motor control unit according to claim 1, wherein said second frame includes an upper barrier wall for preventing dust from attaching to mounting surfaces of the power circuit components mounted on the upper surface of the connecting power distribution board, and a lower barrier wall covering mounting surfaces of the power circuit components mounted on the lower surface of the second frame.

8. A motor drive unit according to claim 7, wherein the power distribution board is fitted within the upper barrier wall of the second frame, and the legs of the first frame are mounted on the upper surface of the power distribution board.

* * * * *